United States Patent [19]

Hashimoto

[11] Patent Number: 5,070,262
[45] Date of Patent: Dec. 3, 1991

[54] SIGNAL TRANSMISSION CIRCUIT

[75] Inventor: Masashi Hashimoto, Garland, Tex.

[73] Assignee: Texas Instruments Incorporated, Dallas, Tex.

[21] Appl. No.: 541,176

[22] Filed: Jun. 20, 1990

Related U.S. Application Data

[63] Continuation of Ser. No. 254,431, Oct. 6, 1988, abandoned.

[51] Int. Cl.⁵ ........................................ H03K 19/0175
[52] U.S. Cl. .................................... 307/475; 307/443; 307/481; 307/242
[58] Field of Search ............ 307/443, 465, 469, 480, 307/481, 475, 247.1, 241, 242; 365/203

[56] References Cited

U.S. PATENT DOCUMENTS

| | | | |
|---|---|---|---|
| 3,702,945 | 11/1972 | Faith et al. | 307/481 |
| 4,769,562 | 9/1988 | Ghisio | 307/465 |
| 4,812,685 | 3/1989 | Anceau | 307/469 |

OTHER PUBLICATIONS

Bakoglu and Meindl, "CMOS Driver and Driver Circuits for Reduced Interconnection Delays", *Proceeding of the Second International Symposium on VLSI Technology, Systems and Applications*, Taipei, Taiwan (May 1985).

Bakoglu and Meindl, "New CMOS Driver and Receiver Circuits Reduce Interconnection Propagation Delays", *Digest of Technical Papers*, 1985 *Symposium on VLSI Technology*, Kobe, Japan, pp. 54–5 (May, 1985).

*Primary Examiner*—Timothy P. Callahan
*Attorney, Agent, or Firm*—James C. Kesterson; James T. Comfort; Melvin Sharp

[57] ABSTRACT

A signal transmission circuit (10) for transmitting a signal ($V_{IN}$) between dies on a wafer. A transmission node (72) is precharged to a first voltage (70) that is representative of a first of a plurality of bit values in response to the actuation of a gate (48) of a P-channel transistor (50) by a first state control signal ($\phi_1$). At a later time, a second state of the control signal ($\phi_1$) actuates a pass gate transistor (38) to couple the end of a first transmission signal line segment (32) to a node (40). A preselected state of the node (40) will cause the signal node (72) to be grounded to a logic zero (74). The signal node (72) is selectively coupled to a latch (92) by a one-shot pass gate (76). The output (102) of the latch (92) is connected to the beginning end of a second transmission line segment (104). The transmission of the signal thus relies on the state of the signal node (72) rather than on the presence or absence of a connection directly to a voltage supply such as $V_{dd}$.

15 Claims, 2 Drawing Sheets

SIGNAL TRANSMISSION CIRCUIT

This application is a continuation of application Ser. No. 07/254,431, filed Oct. 6, 1988, now abandoned.

TECHNICAL FIELD OF THE INVENTION

The present invention relates in general to transmission lines for integrated circuits, and more particularly relates to a signal transmission circuit for transmitting a signal between two transmission line segments.

BACKGROUND OF THE INVENTION

Integrated circuits are often organized in repetitious dies that are arranged on the face of a semiconductor layer. Die-to-die signal transmission lines are used to link the dies together. The simplest sort of die-to-die signal transmission line consists of an CMOS inverter in the first die, a transmission line connected between an output of the first inverter and the input of a second inverter in the second die, and an output from the second inverter.

As system complexity and the I/O count of dies increased, more sophisticated signal transmission circuits became necessary since the power dissipation of the simple inverter design began to account for a non-negligible part of the total system power dissipation. Further, die-to-die signal transmission delays began to limit the system performance.

To improve the performance of die-to-die transmission lines, more complex circuits have been fashioned. Examples are described in H. Bakoglu and J. Meindle, "New CMOS Driver and Receiver Circuits Reduce Interconnection Propagation Delay," *Proceedings of the 1985 Symposium on VLSI Technology*. In one of these circuits, a half $V_{dd}$ is employed instead of a ground or a $V_{dd}$ precharge in a signal transmission line to improve the signal delay and power dissipation of the transmission line. A disadvantage of this particular circuit is that a DC current flows during the precharge at the receiver end, thereby dissipating power. Another circuit proposed in the above paper requires many more control transistors and still does not completely avoid the dissipation of DC power. Moreover, it is difficult to achieve a stable $V_{dd}$-to-precharge with this last circuit. The unstable precharge level creates the possibility of a system malfunction due to incorrect signal transfer.

In view of the foregoing, a need has arisen for a signal transmission circuit with a simple dynamic precharge circuit, a non-full voltage swing and a simple dynamic sensing circuit.

SUMMARY OF THE INVENTION

One aspect of the present invention comprises a signal transmission circuit having a control signal input for inputting a control signal. A transmission signal generator generates a transmission signal on its output in response to receiving a signal on its input. An end of a transmission line segment is coupled to a node for receiving one of a plurality of predetermined bit values therefrom. A voltage supply corresponding to a first of the bit values is selectively coupled by a precharger to the node to precharge the node to a voltage representative of the first bit value. A control electrode of this precharger is actuated by a first state of the control signal to couple the voltage supply to the node.

A second voltage supply corresponding to a second of the bit values is coupled to the node through a switching circuit. The switching circuit has a first control input coupled to the transmission signal generator output. A second control input of the switching circuit is coupled to the control signal input, such that a second state of the control signal and a predetermined state of the transmission signal actuate the switching circuit to couple the node to the second voltage supply. In this manner, a voltage representative of a second bit value will appear on the node and will be transferred to the transmission line segment in the presence of a predetermined state of the transmission signal, and a voltage representative of the first bit value will be transferred to the transmission line segment in the absence of this predetermined state.

In another aspect of the invention, the control signal is also used as an input to a one-shot generator which will generate a one-shot pulse in response thereto. The one-shot pulse is applied to a pass gate which will couple the transmission node to a latch during a predetermined interval of time. After the pulse passes, the transmission node is isolated from the latch. The latch stores a voltage representative of the bit value last transmitted to it from the transmission node, and the output of the latch is connected to the transmission line segment.

In yet a further aspect of the invention, the transmission signal and the control signal are input on a control signal transmission line segment and a first transmission line segment, respectively, and are propagated until they appear at the control inputs of the switching circuit. The transmission node will be brought to a state corresponding to the signal transmitted on the first transmission line segment, and this state is later transferred to a second transmission line segment that is coupled to the node.

The present invention confers at least the following technical advantages. The use of a partitioned signal transmission line allows a first transmission line segment to be precharged to an initial state, such as ground, while the second transmission line segment is propagating the signal. A simple dynamic precharge circuit is used that precharges the transmission node during a first state of the control signal, which same control signal enables a switching circuit to discharge the transmission node when it is in a second state. The transmission node need not have a full swing between ground and $V_{dd}$, thus conserving power. The circuit of the invention avoids undue DC power dissipation.

BRIEF DESCRIPTION OF THE DRAWINGS

Further aspects of the invention and their advantages will be discerned from the following detailed description in conjunction with the appended drawings in which.

DETAILED DESCRIPTION OF THE INVENTION

Figure 1:
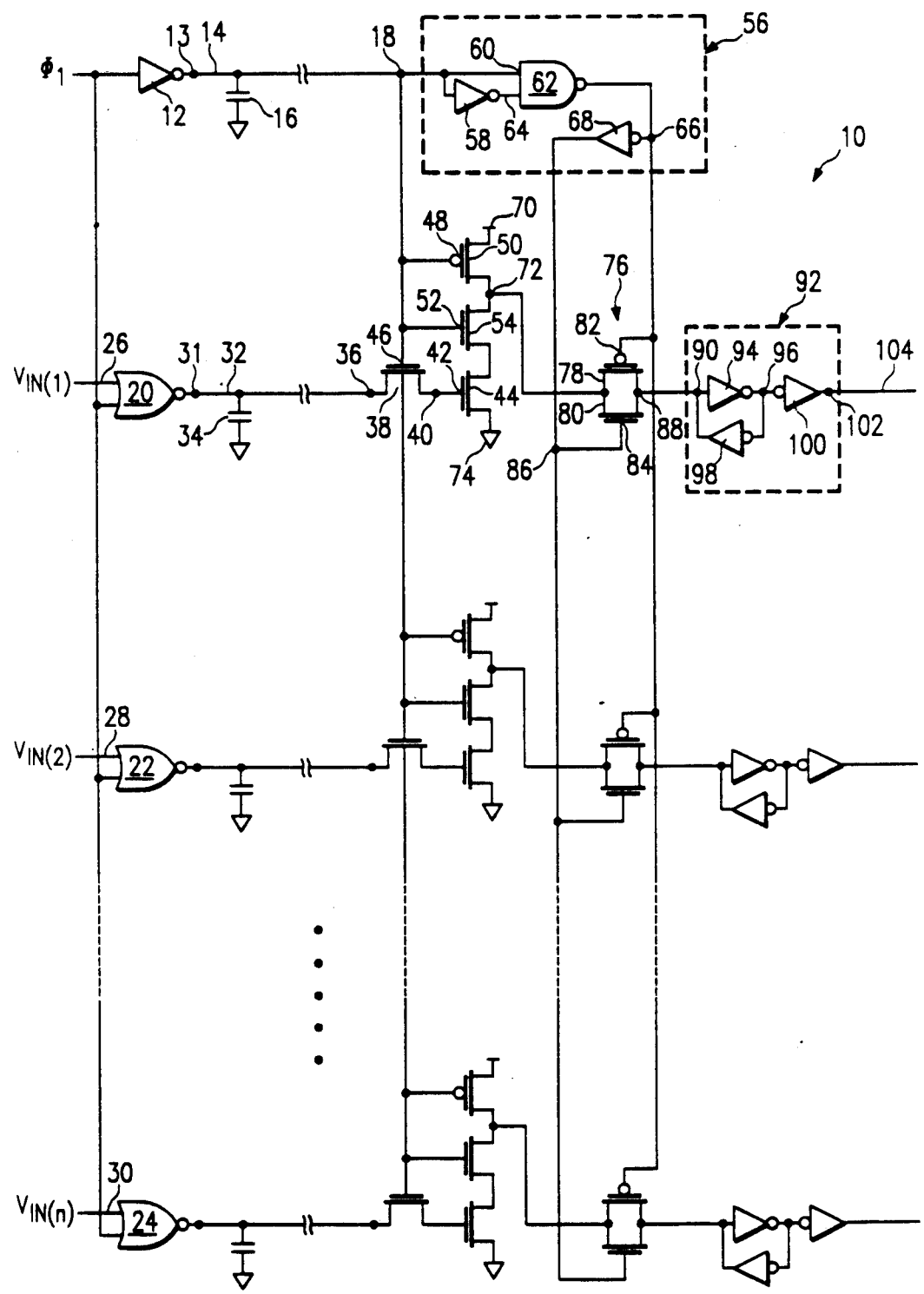
FIG. 1 is an electrical schematic diagram showing a preferred signal transmission circuit according to the invention.

A preferred circuit according to the invention is shown in FIG. 1. The transmission circuit is indicated generally at 10. A control signal source $\phi_1$ is connected to an input of an inverter 12. An output of inverter 12 is connected to a first end 13 of a control signal transmission line segment 14. Transmission line segment 14 has a capacitance modelled at 16. A second end of the transmission line segment 14 is connected to a node 18 which occurs approximately midway between two integrated circuit dies which the circuit 10 is designed to connect. These dies or chips can be DRAMs, SRAMs, gallium arsenide chips, gate arrays, application-spec logic, or signal processors. The inverter 12 is located in the first of the these two dies.

The control signal source $\phi_1$ is also connected to an input of each of a plurality of NOR gates, three such NOR gates 20, 22 and 24 here being shown for purposes of clarity, it being understood that many more such NOR gates can be provided. The NOR gates 20, 22 and 24 are located within the first integrated circuit die. The NOR gate 20 has a transmission signal input 26 for inputting a first transmission voltage signal $V_{IN(1)}$. In a similar manner, the NOR gate 22 has an input 28 connected to a transmission signal source $V_{IN(2)}$, and the NOR gate 24 has an input 30 connected to a transmission signal source $V_{IN(n)}$. As will become apparent, the control signal source $\phi_1$ is thus able to gate each of a plurality of transmission signals that are intended to be transmitted from one die to another.

The transmission circuit for transmission $V_{IN(1)}$ is similar to the circuits used for transmitting $V_{IN(2)}$ and $V_{IN(n)}$. Therefore, only the circuit components used for in connection with each transmission signal together with the circuit components relating only to $V_{IN(1)}$ will be more particularly described. An output of NOR gate 20 is connected to a first end 31 of first transmission line segment 32, which has a capacitance modeled at 34. A second end of the transmission line segment 32 is connected to a node 36. A current path of an N-channel pass gate transistor 38 is operable to connect the node 36 to a node 40, which in turn is connected to a gate 42 of an N-channel switching transistor 44.

Control signal node 18 is connected to a gate 46 of the pass gate transistor 38. The control signal node 18 is further connected to a gate 48 of a P-channel precharge transistor 50 and a gate 52 of an N-channel transistor 54.

Control node 18 is finally connected to the input of a one-shot pulse generator indicated generally at 56 by the dashed enclosure. More particularly, the node 18 is connected to the input of an inverter 58 of the one-shot pulse generator 56, and to an input 60 of a NAND gate 62 thereof. An output of the inverter 58 is connected to a second input 64 of the NAND gate 62. The delay caused by the inverter 58 will cause inputs 60 and 64 to be at different states for a predetermined period of time, and therefore will cause a pulse to appear on an output node 66 of the one-shot generator 56. Output node 66 also serves as an input to an inverter 68.

The current path of transistor 50 has a source connected to a voltage supply 70 that for example can be $V_{dd}$ or a fraction thereof. The drain of the P-channel transistor 50 is connected to a transmission signal node 72. The transmission node 72 is further connected to the drain of the N-channel transistor 54. The source of transistor 54 is connected to the drain of the N-channel transistor 44, whose current path connects its drain to a second voltage supply 74 or $V_{ss}$, which can be ground or another voltage potential sufficiently lower than the potential of voltage supply 70 that at least two distinct states can be represented.

The transmission node 72 is further connected to an input of a CMOS pass gate indicated generally at 76. The pass gate 76 consists of a P-channel transistor 78 and an N-channel transistor 80. A gate 82 of the P-channel pass gate transistor 78 is connected to the output node 66 of the one-shot generator 56. A gate 84 of the N-channel transistor 80 is connected to a second output node 86 that is in turn connected to the output of the inverter 68 of the one-shot generator 56. An output 88 of the CMOS pass gate is connected to an input node 90 of a latch indicated generally at 92 by a dashed enclosure.

The input node 90 of the latch 92 is connected to the input of an inverter 94, which in turn has an output connected to a node 96. The node 96 is connected to the input of an inverter 98 that has its output connected back to the input node 90. The input node 96 is further connected to the input of an inverter 100, which also is connected to an output 102 of the latch. This output 102 of the latch is connected to an end of a second signal transmission line segment 104.

Figure 2:
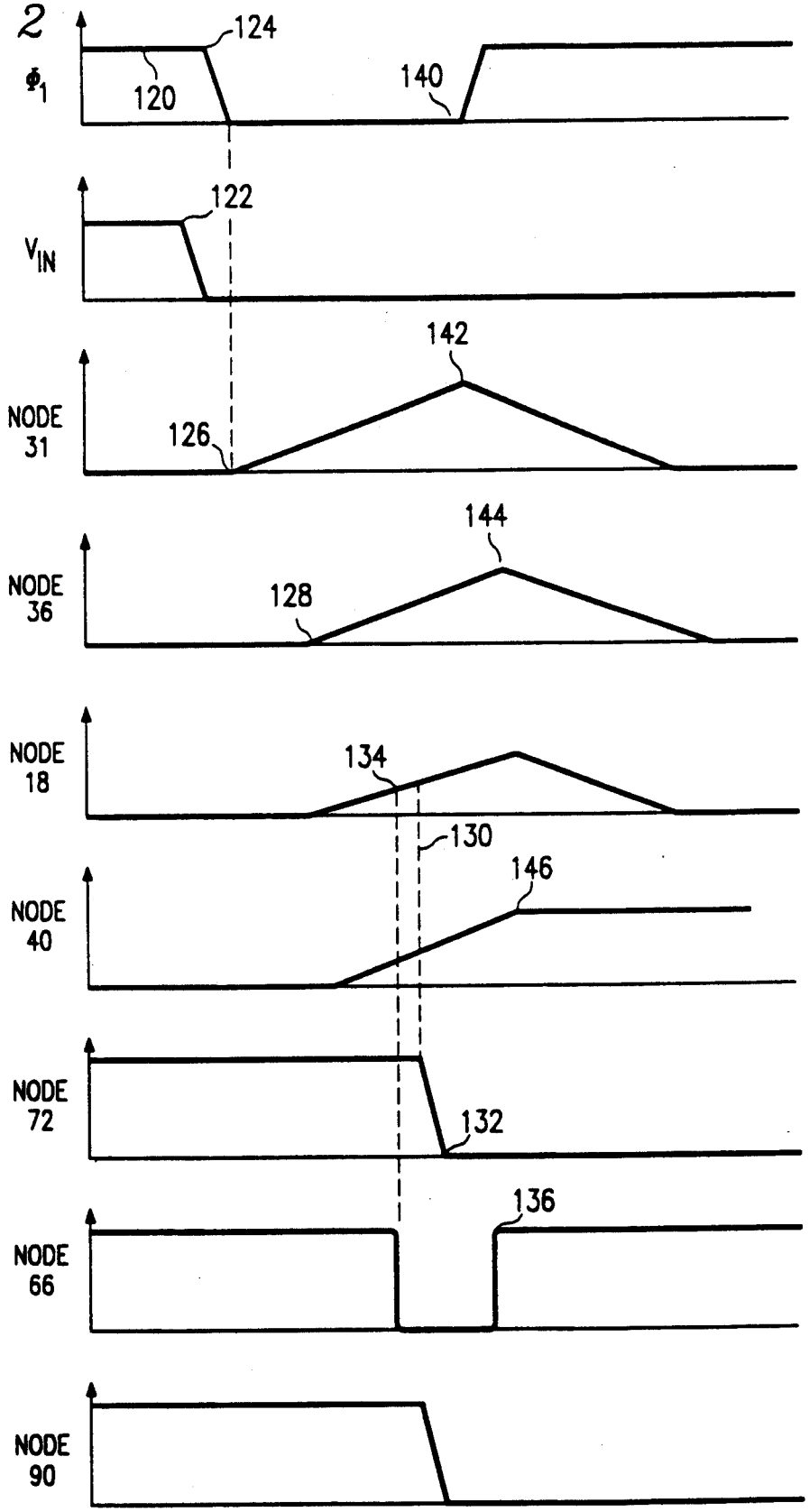
FIG. 2 is a timing diagram showing the operation of the circuit illustrated in FIG. 1.

The operation of transmission circuit 10 can best be described with the aid of the timing diagram illustrated in FIG. 2. At a beginning time 120, the control signal $\phi_1$ is high. The control signal transmission line segment 14 will have been discharged to ground, as will node 18. Since $\phi_1$ is high, the output of NOR gate 20 will be low, and nodes 31 and 36 on the first transmission line segment 32 will be at ground. For simplicity, only that portion of the circuit relevant to the transmission of $V_{IN(1)}$ will be described.

FIG. 2 illustrates the case where a logic "0" is desired to be transmitted from $V_{IN(1)}$ to the end 102 of the second transmission line segment 104. At a time 122, $V_{IN}$ begins to go low. It is preferred that $\phi_1$ go low at a time 124 that is after time 122. Node 31, which is at the beginning end of the first signal transmission line segment 32, will begin to go high at time 126. The high-going signal will be propagated on the transmission line segment 32 until its end node 36 also begins to go high at time 128. Node 18 on the control signal transmission line segment will also start to go high at approximately at or somewhat before this time.

As long as the control signal $\phi_1$ is high, its inverse $\overline{\phi_1}$ will be low. Therefore, the gate 48 of the P-channel transistor 50 will be turned on, allowing the precharging of the transmission signal node 72 by the voltage supply 70. A low signal $\phi_1$ also acts to turn off N-channel transistor 54, which will in turn disable the pull-down capability of transistor 44.

At a time 130, node 18 reaches the voltage threshold of N-channel transistor 54, making the current path thereof conductive. Simultaneously, the current path of P-channel transistor 50 is being turned off by an increasingly high voltage on its gate 48. The push-pull action of this control signal change will cause the signal node 72 to begin to drop until a logic "0" state is reached at 132, assuming a low state of $V_{IN(1)}$.

At a time 134 prior to time 130, control node 18 became sufficiently high that the one-shot generator 56 was actuated to trigger a pulse at its first output 66. This pulse signal and its complement on node 86 render the pass gate 76 conductive to transmit the logic state of transmission signal node 72 to the input 90 of latch 92. A logic "0" state appearing at input 90 will be stored as its inverse within the latch 92, and will be output on the second transmission line segment 104 as a logic "0". Therefore, a logic "0" appearing at $V_{IN(1)}$ will be transmitted to the second transmission line segment 104. The one-shot pulse ends at a time 136, thereby decoupling the state of signal node 72 from the input 90 of the latch 92.

Had $V_{IN(1)}$ been high, and therefore $V_{IN(1)}$ low as transmitted on transmission line segment 32, node 40 would be low and pulldown transistor 44 would turned off. A high state would therefore persist at node 72 and be transmitted to the second transmission line segment 104.

One of the advantages of the invention is that the first transmission line segment 32 can be precharged to an initial condition (logic "0") while the transmission of the signal is still going on on the second transmission line segment 104. This process starts at a time 140 when the control signal $\phi_1$ starts to go high. Shortly thereafter, the NOR gate 20 will be actuated to begin decreasing the voltage on its output node 31 at a time 142. This trailing edge will be propagated on the transmission line segment 32 until the state of node 31 is reflected at the node 36 at a time 144. At about the same time, the voltage at node 18 will begin dropping. The structure of inverter 12, transmission line segment 14, NOR gate 20 and transmission line segment 32 can be defined such that a high state at node 18 will drop off sooner than a corresponding high state at the node 36. For instance, transmission line segment 14 can be fabricated to have less resistance than segment 32 and therefore a smaller RC time constant. This in turn will cause the pass gate transistor 38 to disconnect node 36 from node 40. Therefore, node 40 will be isolated from the condition of the transmission line 32 at a time 146, and a high state will exist on node 40 for a period of time sufficient to transmit the state on signal node 72 forward onto the second transmission line segment 104. This effectively decouples the first transmission line segment 32 from the second transmission line segment 104, such that the first transmission line segment can be discharged to logic "0" at the time that a bit of information is being transmitted on the second transmission line segment 104.

A principal advantage of the invention inheres in the use of a signal node 72 to propagate the signal state rather than directly by a voltage supply. This 30 makes possible a voltage representative of a logic "1" that may be substantially lower than $V_{dd}$ and a voltage representative of a logic "0" that may be substantially higher than 0 volts. The voltage swing between the high and low logic states need only be sufficient to cause the latch node 96 to be brought to a bit value inverted from the state of node 72. The voltage swing between the high and low states can be minimized, and excessive power dissipation can therefore be alleviated.

The illustrated structures of the one-shot generator 56, the pass gate 75 and the latch 92 are only representative, and can be substituted by other circuitry of like function. Further, while it is preferred that the transmission circuit be used to propagate a signal from a first transmission line segment from a second transmission line segment, the transmission circuit 10 illustrated can also be used as an initial transmission signal generator at the beginning of a transmission line.

In summary, a novel transmission line circuit has been disclosed that allows the discharging of a first transmission line segment while the signal is being transmitted on a second transmission line segment, and further relies on the state of a transmission node to transmit the bit value rather than on selective connection to a voltage supply.

While a preferred embodiment of the invention and its advantages have been described in the above detailed description, the invention is not limited thereto but only by the spirit and scope of the appended claims.

What is claimed is:

1. A signal transmission circuit, comprising:
   a first transmission line segment having first and second ends; a gate having an output coupled to said first end of said first transmission line segment, a first input of said gate for receiving an input signal;
   a control signal, a second input of said gate coupled to said control signal, said gate operable to output an inverse of said input signal to said first transmission line segment in response to receiving a predetermined value from said control signal;
   a precharger coupled to a node for selectively precharging said note to a first voltage level representing a preselected bit value;
   switching circuitry and a second voltage level supply, a current path of said switching circuitry operable to connect said second voltage level supply to said node, a control terminal of said switching circuitry coupled to said second end of said first transmission line segment for operating said switching circuitry;
   a pulse circuit for generating a signal pulse in response to said control signal;
   a pass gate operating in response to said signal pulse generated by said pulse circuitry, said pass gate having an input and an output, said input of said pass gate coupled to said node, a latch having an input coupled to said output of said pass gate, such that the state of said node is transmitted to said latch during a predetermined interval of time and stored by said latch; and
   a second transmission line segment, an output of said latch coupled to said second transmission line segment for transmitting said state stored by said latch thereto.

2. The circuit of claim 1, wherein said precharger has a control terminal coupled to a control signal source, said control signal source operable to generate a second control signal which varies between two levels, a first of said levels operable to connect said first voltage level supply to said node to precharge said node.

3. The circuit of claim 2, wherein an enabling terminal of said switching circuit is coupled to said control signal enabling the operation of said switching circuitry by a predetermined signal value on said first transmission line segment.

4. The circuit of claim 1, and further comprising a control signal source, an enabling terminal of said switching circuitry coupled to said control signal source, a predetermined level of said second control signal enabling said switching circuitry to be operated by a predetermined state on said second end of said first transmission line segment.

5. The circuit of claim 4, wherein said second control signal course comprises an inverter, an input of said inverter receiving said control signal.

6. The circuit of claim 1, wherein said pulse circuit is a one-shot generator having an input and an output, and further comprising a control signal source for producing a second control signal coupled between said control signal and said input of said one-shot generator, at least one control terminal of said pass gate coupled to said output of said one-shot generator, said one-shot generator generating a one-shot pule in response to receiving a predetermined level of second control signal, said one-shot pulse making said pass gate conductive for a predetermined period of time.

7. The circuit of claim 6, and further comprising a control signal transmission line segment having a second end coupled to said one-shot signal generator and a first end coupled to said control signal source, said control signal transmission line segment having an RC time constant not greater than the RC time constant of said first transmission line segment.

8. A signal transmission circuit, comprising:
a plurality of first transmission line segments having first and second ends, and each having an RC time constant;
a control signal source, a control signal transmission line segment having an input end coupled to an output of said control signal source, and an out put end, said control signal transmission line segment having an RC time constant no greater than the RC time constant of said first transmission line segments;
for each of said first transmission line segments, a respective precharger for precharging a respective node to a voltage level representative of a first of a plurality of bit values;
a respective switching circuit for each of said nodes, a current path of each of said switching circuits operable to connect one of said respective nodes to a supply of a second voltage representative of a second of said bit values;
each said switching circuits having a control terminal and an enabling terminal for controlling the conductance of said current path, said enabling terminals connected to said output end of said control signal transmission line, said control terminals each connected to said second end of a respective first transmission line segment;
a one-shot generator having an input connected to said output end of said control signal transmission line, and an output;
a plurality of gate passes having inputs connected to respective ones of said nodes and having outputs, first end s of a respective plurality of second transmission line segments connected to said outputs of respective ones of said pass gates, control terminals of said pass gates connected to said output of said one-shot generator;
a predetermined one of two levels of a transmission signal appearing at a second end of a respective first transmission line segment operable to actuate a respective switching circuit, a predetermined levels of said control signal operable to enable each of said switching circuits to be actuated by said predetermined state of a respective transmission signal; and
said one-shot generator operable to generate a one-shot pulse on its output in response to said predetermined state of said control signal, each said pass gate operable to couple a first end of a respective second transmission lien segment to a respective node in response to receiving said one-shot pulse, such that the state represented at each respective node is transferred to a respective second transmission line segment.

9. A method for transmitting a signal, comprising the steps of:
precharging a transmission node to a first voltage level representative of a first of at least two bit values in response to receiving a first value of a control signal;
providing switching circuitry for selectively connecting the transmission node to a source of a second voltage level representative of a second of said at least two bit values;
enabling said switching circuitry in response to receiving a second value of said control signal;
actuating said enabled switching circuitry to connect said transmission node to the source of said second voltage level in response to a first value of a transmission signal, such that a signal representative of said second of said at least two but values exits at said node; and
transferring said signal at said transmission node to a transmission line segment.

10. The method of claim 9, and further comprising the steps of:
inputting said second value of said control signal into a one-shot generator at the same time as said step of enabling said switching circuitry;
generating a one-shot pulse having an interval in response to receiving said second value of said control signal;
driving said transmission node to one of said first and second voltage levels during the interval of said one-shot pulse corresponding to the value of said transmitted signal; and
using said one-shot pulse to enable a pass gate to couple said transmission node to a second transmission line segment.

11. The method of claim 10, and further comprising the step of:
latching said signal at said transmission node after said signal has passed said pass gate such that said second transmission line segment is driven to said latched signal.

12. A signal transmission circuit, comprising:
a precharger coupled to a transmission node for precharging said node to a first voltage representative of a first of at least two bit values;
switching circuitry for selectively connecting said node to a source of a second voltage representative of a second of said bit values;
a control signal source coupled to said switching circuitry, wherein a predetermined state of a control signal generated by said control signal source is operable to enable said switching circuitry to selectively connect said node to said source of said second voltage;
a transmission signal generator coupled to said switching circuitry by a first transmission line signal a first level of a transmission signal operating said switching circuitry to connect said node to said source of said second voltage when said switching circuitry is enable by said predetermined level of said control signal, such that a level representative of said second of said bit values exits at said node, a second level of said transmission signal failing to so operate said switching circuitry such that a level representative of said first of said bit values exits at said node;
a second transmission line segment coupled to said node for receiving a signal from said first transmission line segment; and
an isolation circuit for isolating said first transmission line segment from said second transmission line segment, said precharger operable to selectively precharge said first transmission line segment to a beginning value, such that a voltage representing one of said bit values may be transmitted on said second transmission line segment while said first transmission line segment is precharged to said beginning value.

13. The circuit of claim 12, wherein said isolating circuit comprises a pass gate, an input of said pass gate coupled to said node, an output of said pass gate coupled to an end of said first transmission line segment, said pass gate further having at least one control terminal;

a one-shot generator for receiving a predetermined value of said control signal and producing a one-shot pulse on at least one output thereof in response to said predetermined value, said output coupled to said control terminal of said pass gate such that said pulse actuates said pass gate to pass the value at said node to the output of said pass gate.

14. The circuit of claim 12, and further comprising a latch having an input coupled to said node and an output coupled to said second transmission line segment, said latch operable to output the state of the input of said latch onto said second transmission line segment until the value of the input of said latch is changed.

15. The circuit of claim 12, wherein said precharger comprises a precharger switch having a control terminal, said control terminal of said precharger switch coupled to said control signal source, a second predetermined value of said control signal actuating said precharger switch to connect said first voltage to said node.

* * * * *